United States Patent
Ray et al.

[11] Patent Number: 6,058,841
[45] Date of Patent: May 9, 2000

[54] PLANOGRAPHIC PRINTING

[75] Inventors: Kevin Barry Ray; Christopher David McCullough, both of Leeds, United Kingdom

[73] Assignee: Kodak Polychrome Graphics LLC, Norwal, Conn.

[21] Appl. No.: 09/318,881

[22] Filed: May 26, 1999

Related U.S. Application Data

[63] Continuation of application No. PCT/GB98/02925, Sep. 29, 1998.

[30] Foreign Application Priority Data

Sep. 30, 1997 [GB] United Kingdom .................. 9720595

[51] Int. Cl.$^7$ ....................................................... B41C 1/10
[52] U.S. Cl. ......................... 101/467; 101/465; 101/478; 101/487
[58] Field of Search .................... 101/457, 462, 101/463.1, 465, 466, 467, 478, 487, 488; 430/303

[56] References Cited

U.S. PATENT DOCUMENTS

| | | | |
|---|---|---|---|
| 4,074,009 | 2/1978 | Sanders | 101/457 |
| 4,086,093 | 4/1978 | Ezami et al. | 430/303 |
| 4,833,486 | 5/1989 | Zerillo | 101/450.1 |
| 4,909,151 | 3/1990 | Fukui et al. | 101/463.1 |
| 4,930,417 | 6/1990 | Isobe | 101/465 |
| 5,045,697 | 9/1991 | Schneider | 101/487 |
| 5,440,987 | 8/1995 | Williams et al. | 101/467 |
| 5,713,287 | 2/1998 | Gelbart | 101/467 |
| 5,768,995 | 6/1998 | Miyaguchi et al. | 101/463.1 |
| 5,819,661 | 10/1998 | Lewis et al. | 101/467 |

FOREIGN PATENT DOCUMENTS

| | | |
|---|---|---|
| 0664211 | 7/1995 | European Pat. Off. . |
| 0764522 | 3/1997 | European Pat. Off. . |
| 201899 | 11/1984 | Japan ..................... 101/478 |
| WO9749557 | 12/1997 | WIPO . |
| WO9832608 | 7/1998 | WIPO . |

*Primary Examiner*—Stephen R. Funk
*Attorney, Agent, or Firm*—Baker & Botts, L.L.P.

[57] ABSTRACT

A formulation comprising a heat sensitive cross-linkable ink and carbon black is coated over substantially the entirety of an ink-repellent/ink-releasing surface of a printing cylinder of a printing press by heating the formulation and/or the outer surface of the printing cylinder so that the formulation adheres to the cylinder to provide a continuous coating thereon. The coated printing cylinder is then allowed to cool to ambient temperature whereafter it can be imaged using a digitally controlled laser. The imaged printing cylinder may be developed during press start up by application of waterless ink over the cylindter surface in order to remove the non-imaged areas comprising non-cross-linked ink. After completion of printing, the printing cylinder can be cleaned by using an appropriate solvent to solubilize the cross-linked ink in the imaged areas and subsequently re-used.

30 Claims, 1 Drawing Sheet

INK ACCEPTANCE (2) > INK ACCEPTANCE (1)

PLANOGRAPHIC PRINTING

This is a continuation of copending application Ser. No. PCT/GB98/02925 filed Sep. 29, 1998 which is incorporated by reference herein.

BACKGROUND OF THE INVENTION

This invention relates to planographic printing and particularly, although not exclusively, relates to waterless lithographic printing.

Lithographic processes involve establishing image (printing) and non-image (non-printing) areas on a substrate, substantially on a common plane. When such processes are used in printing industries, non-image areas and image areas are arranged to have different affinities for printing ink. For example, non-image areas may be generally hydrophillic or oleophobic and image areas may be oleophilic. In "wet" lithographic printing, a dampening or fount (water-based) liquid is applied initially to a printing form prior to application of ink so that it adheres to the non-image areas and repels oil based inks therefrom. In "dry" or "waterless" printing, ink is repelled from non-image areas due to their release property.

Most lithographic printing at the present time is of the "wet" type and, therefore, requires application of a fount-solution during the printing process. However, lithographic printing forms for such processes may suffer from a number of disadvantages. Some of these are:

a) Providing the appropriate irk-water balance during press operation is difficult and requires great experience. If the correct ink-water balance is not achieved, "scumming" is caused wherein the printed ink image extends into the non-image areas thereby ruining the printed image.

b) Adjustment of the ink-water balance at start-up or re-start is particularly difficult and cannot be stabilized until a large number of sheets have been printed, thus incurring waste.

c) The ink tends to become emulsified which leads to poor adherence of the ink to ink-accepting areas of the printing form which causes problems in color reproduction and dot reproduction.

d) The printing process has to be provided with a dampening system, thus increasing its size and complexity. In addition, dampening solutions contain undesirable volatile organic compounds.

e) The printing form care chemistry and fount solutions require careful control and selection. In addition, printing form cleaners contain significant levels of solvent which is not desirable.

While waterless printing forms have been known for many years and potentially have advantages over forms of the "wet" type, there are few commercial waterless forms and those that are sold tend to be more expensive than those of the "wet" type.

One problem associated with waterless printing is that the printing forms become hot during printing and it is found that this tends to increase the adhesion of ink to non-image areas of the form and lead to scumming, with consequent reduction in the quality of prints typically produced. This problem is combatted on commercial presses by cooling the printing form and/or the ink during printing to maintain the temperatures within a narrow temperature band.

Currently, there is interest in imaging and/or developing printing forms directly on a printing cylinder of a printing press itself, thereby removing the need to image and/or develop a plate in a separate apparatus prior to attaching it to a press. For example, our co-pending patent application number GB 96 12233.8 describes a printing form that may be prepared directly on the press, by coating a hydrophillic surface of a support with a radiation sensitive ink; imaging the ink coating by digital laser means; and acting on the form with aqueous dampening rollers to remove unexposed areas of the ink coating to reveal the hydrophillic surface of the support and to leave an ink image formed from the ink which is oleophilic after exposure.

It is an object of the present invention to address problems associated with known planograrhic printing forms and methods for their preparation.

SUMMARY OF THE INVENTION

According to a first aspect of the present invention, there is provided a method of preparing a waterless printing form precursor using a support having a surface which is relatively non-accepting of an ink-accepting formulation at a first viscosity and relatively accepting of the ink-accepting formulation at a second viscosity, the method comprising contacting the ink-accepting formulation at said second viscosity with said surface in order to coat said surface with said formulation.

Viscosity of a fluid is generally related to the temperature of the fluid. Accordingly, the invention extends to a method of preparing a waterless printing form precursor using a support having a surface which is relatively non-accepting to an ink-accepting formulation at a first temperature and relatively accepting to the ink-accepting formulation at a second temperature, the method comprising contacting said surface and said ink-accepting formulation at said second temperature in order to coat said surface with said formulation.

In the method, the temperature of said ink-accepting formulation and/or said surface may be increased so that during contact of the ink-accepting formulation and said surface said ink-accepting formulation has said second viscosity and/or said second temperature so that said surface may be coated.

Said support may comprise a conventional support used to prepare a waterless lithographic printing plate. However, it preferably comprises a support, for example a cylinder, of a printing press. In this case, the printing form is suitably prepared on press. Said surface may be an integral part of a printing cylinder or may be separable from a printing cylinder. For example, it may be part of a covering means, for example a sleeve, which is suitably releasably securable to a printing cylinder.

Thus, the method may include the step of arranging a support in position prior to said contacting step and/or associating said covering means with said support prior to said contacting step.

Properties of said ink-accepting formulation are suitably changeable on exposure to imaging radiation. The viscosity of said formulation may be changeable on exposure to radiation. For example, said formulation may be cross-linkable and/or capable of polymerization on exposure.

Exposure of said ink-accepting formulation to imaging radiation is preferably arranged rot to reduce the tendency of the formulation to adhere to said surface. Preferably, exposure is arranged to increase the tendency of the formulation to adhere to said surface.

DETAILED DESCRIPTION OF THE INVENTION

Figure 1:
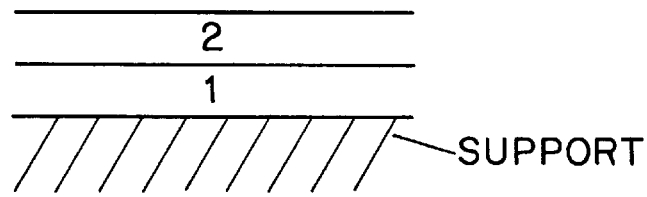
FIG. 1 depicts a side view of one embodiment of the invention.
Figure 2:
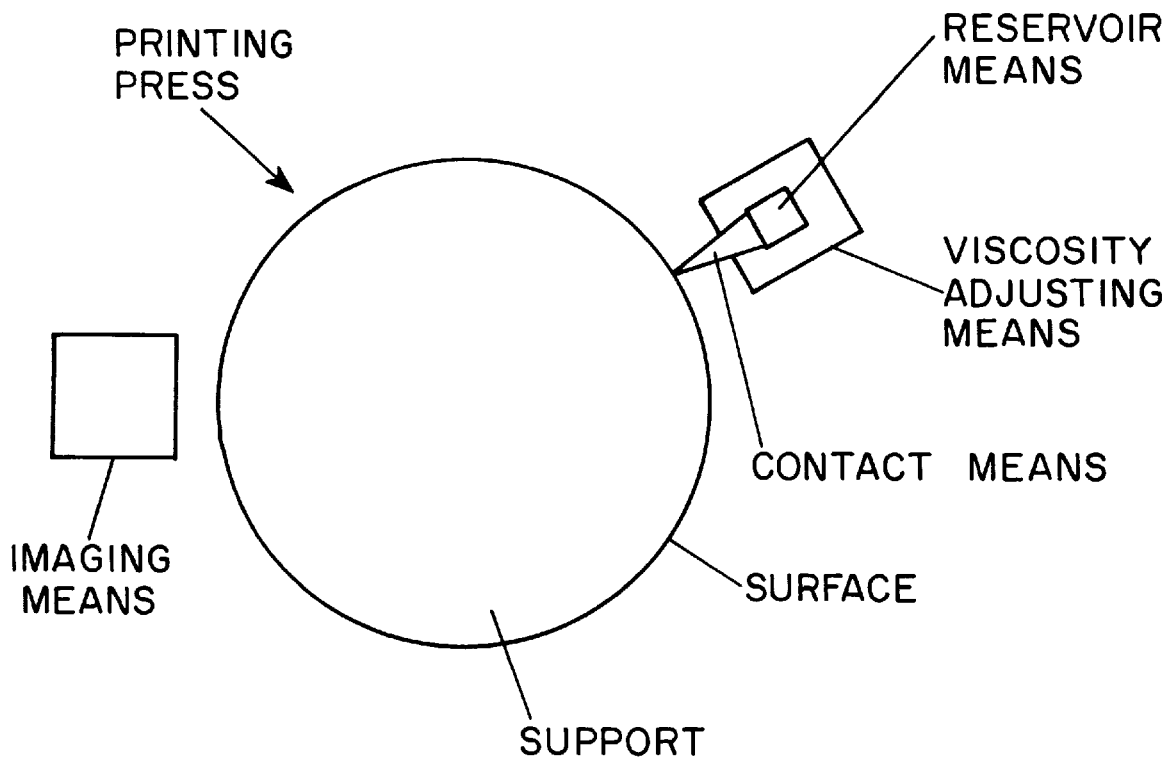
FIG. 2 depicts a side view of the printing press embodiment of this invention.

Imaging radiation as described may comprise visible, ultra-violet or infra-red radiation. Radiation may be supplied by any known means, for example, imaging radiation in the form of heat may be supplied using a heated body, for example a heated stylus. Alternatively, said radiation may be supplied using a laser for example which suitably emits in the near-IR region between 700 and 1500 nm.

Said ink-accepting formulation preferably comprises a first component which is suitably ink-accepting and is preferably changeable on exposure to radiation as described. Said first component preferably comprises a material which is cross-linkable and/or polymerisable on exposure to radiation. Said first component is preferably heat-sensitive. It preferably comprises an ink, especially waterless ink.

Said printing form precursor preferably includes a component arranged to absorb radiation and suitably to cooperate with said first component for changing its properties. For example, said ink-accepting formulation may include a second component which is suitably arranged to absorb radiation, especially infra-red radiation. Radiation from an Ar-ion source may be absorbed by some materials and converted to heat. Alternatively, a second component as described herein may be incorporated in a material in contact with said ink-accepting formulation.

Said second component may comprise a black body absorber such as carbon black or graphite. It may be a commercially available pigment such as Heliogen Green as supplied by BASF, Nigrosine base NG1 as supplied by NH Laboratories Inc. or Milori Blue as supplied by Aldrich.

Said second component may be an organic pigment or dye such as phthalocyanine pigment; or it may be a dye or pigment of the squarylium, merocyanine, cyanine, indolizine, pyrylium or metal dithioline classes.

Examples of such compounds are:

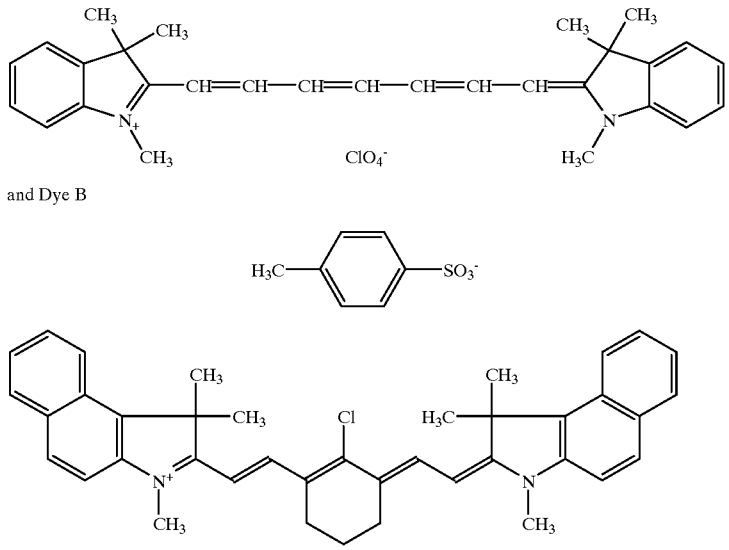

and Dye B and Dye C, KF654 B PINA as supplied byz Riedel de Haen UK, Middlesex, England, believed to have the structure:

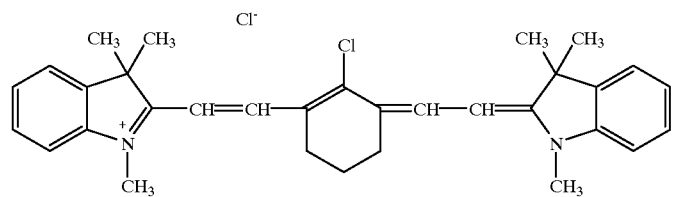

Said formulation may include at least 1 wt %, preferably at least 2 wt % of said second component. Preferably said formulation includes less than 25 wt %, more preferably less than 15 wt % of said second component. Said formulation may include one or more second components of the type described wherein the wt % referred to refer to the total of all such second components.

Said ink-accepting formulation preferably comprises said first component as a major portion thereof.

Said relatively non-ink accepting surface of said support may-comprise any surface conventionally used as part of a printing surface in waterless lithographic printing. Said surface suitably comprises a release material which may include a siloxane component.

Said second temperature is preferably greater than said first temperature, suitably by at least 5° C., preferably at least 10° C., more preferably at least 15° C., especially at least 20° C.

Said first temperature may be in the range 20° C. to 40° C., preferably in the range 25° C. to 35° C.

The thickness of the ink-accepting formulation coated on said surface may be adjusted in dependence upon the desired run length of a printing form preparable from sand precursor. Thus, the method may include the step of predetermining the desired run length of the form and adjusting the thickness of the coating accordingly. For example, for a lower run length a coating thickness of 0.1 to 0.5 μm may be suitable; for a higher run length a thickness of 3 μm may be suitable. One advantage of using thinner coatings for short run lengths is that such coatings require a shorter imaging time than thicker coatings.

In another aspect of the present invention, there is provided a waterless printing form precursor comprising a support having a relatively non-ink-accepting surface coated with an ink-accepting formulation.

Said surface is suitably relatively non-ink accepting when dry—that is, suitably in the absence of water.

In another aspect of the present invention, there is provided a method of preparing a waterless printing form having image and non-image areas, the method comprising:

imagewise exposing a printing form precursor which comprises a support having a surface which is relatively non-accepting of an ink-accepting formulation at a first viscosity and relatively accepting of the ink-accepting formulation at a second viscosity and an ink-accepting formulation coated over said surface; and selectively removing areas under conditions wherein the viscosity of the ink-accepting formulation is different to said second viscosity.

In another aspect of the present invention, there is provided a method of preparing a waterless printing form having image and non-image areas, the method comprising:

imagewise exposing a printing from precursor which comprises a support having a surface which is relatively non-accepting of an ink-accepting formulation at a first viscosity and relatively accepting of the ink-accepting formulation at a second viscosity and an ink-accepting formulation coated over said surface; and selectively removing areas, for example unexposed areas, at a temperature, wherein the ink-accepting formulation has a viscosity which is higher than said second viscosity.

The invention also provides a method of preparing a waterless printing form having image and non-image areas, the method comprising: imagewise exposing a printing form precursor which comprises a support having a surface which is relatively non-ink accepting to ink at a first temperature and relatively ink-accepting to ink at a second temperature and an ink-accepting formulation coated over said surface; and removing unexposed areas at a third temperature which is less than said second temperature.

The ink-accepting formulation may be used in the removal of said unexposed areas. For example, said unexposed areas may be contacted with ink-accepting formulation. Said ink-accepting formulation of said coating preferably comprises a waterless lithographic ink which may be substantially the same as the ink-accepting formulation used in said removal. As an alternative, a separate developer wash may be used in the removal of said unexposed areas.

Said first temperature and said third temperature may be substantially the same.

Imagewise exposure of said precursor may comprise heat-mode imaging. This may be achieved using a heated body for example a heat stylus. Preferably, however, it is carried out using a laser which is suitably computer controlled. Preferably, the laser emits at above 600 nm.

The invention extends to a method of preparing a printing form as described above for re-use, the method comprising removing image-areas of said form, for example by dissolution and/or by adjustment of temperature.

According to another aspect of the present invention, there is provided a printing press comprising:

a support having a surface which is relatively non-ink-accepting;

contact means for contacting said surface with an ink-accepting formulation in order to coat said surface; and means for adjusting the viscosity of said ink-accepting formulation.

Said means for adjusting viscosity may include a temperature adjustment means for adjusting the temperature of said ink-accepting formulation at the time of contact between it and the surface.

Said temperature adjustment means is preferably for adjusting the temperature of contact between a first temperature and a second temperature. Means may be provided for maintaining the temperature of the surface within a predetermined temperature range.

Said press preferably includes means for adjusting the amount of formulation applied to said surface to adjust the thickness of the coating.

A reservoir means is preferably provided for delivery of ink-accepting formulation to said contact means.

Said press preferably includes imaging means for imaging the coating on said surface. Said imaging means preferably comprises a digital imaging means, for example a digital imaging head which is suitably an image setter comprising a laser which can scan in an imagewise manner across the surface in response to image signals stored in computer.

Said press preferably includes means for delivering printing ink so that it adheres to ink-accepting areas for use in printing a copy.

Said press preferably includes means for delivering a development means for removing unexposed areas of an imaged layer. In one embodiment, the development means may comprise said ink-accepting formulation; in another embodiment it may comprise printing ink used in printing a copy. In a further alternative, said developer means may be a separate developer wash.

Said reservoir means and said means for delivering printing ink may be one and the same of said ink-accepting formulation and the printing ink are the same. In addition, where said development means comprises said ink-accepting formulation, said means for delivering the development means and said reservoir means may be one and the same.

Said press may include renewing means for renewing said surface of said support. Such means may comprise means for removing material from said support and/or may comprise a means for providing a covering means, for example a sleeve. For example a storage means for material, for example a roll of material which is arranged to provide the surface on the support may be associated with the press. When the surface is to be renewed, material may be dispensed from said storage means; and, suitably, removed material may be directed to another or the same storage means. Thus, with such a system, all operations can be carried out in situ on the press, with the exception of the need for occasional renewal of the storage means with new material.

The invention extends to a method of waterless printing using a printing form as described herein.

Preferably, waterless ink is used in said printing which is preferably substantially the same as said ink-accepting formulation described herein and/or is substantially the same as the waterless ink used for removing unexposed areas.

Any feature of any aspect of any invention or embodiment described herein may be combined with any feature of any other aspect of any invention or embodiment described herein.

Specific embodiments of the invention will now be described, by way of example.

The following products are referred to hereinafter:

PS444—a vinyl-terminated polydimethylsiloxane obtained from Petrarch Systems Inc of Bristol U.S.A.

PS123—a (30–35%) methylhydro (65–70%) dimethylsiloxane copolymer from Fluorochem Limited of Derbyshire, England.

PC072—a platinum/vinylsiloxane catalytic complex solution in xylene obtained from Petrarch Systems Inc. of Bristol U.S.A.

UV Cyan ink PB377—Sahara (Trade Mark) low viscosity UV curing waterless cyan ink from Classic Colours Ltd of Berkshire, England.

KF654B—a polymethine dye obtained from Riedel-de Haën AG of Germany.

EXAMPLE 1
General Description

Commercially available heat-sensitive cross-linkable inks for use in waterless lithographic printing are found to adhere more strongly to an ink-repellant or ink-releasing surface of a printing form as the temperature of the form and/or the ink increases. This factor is detrimental in relation to conventional waterless lithographic printing forms (since it leads to scumming) and, accordingly, steps are normally taken to prevent rises in the temperature of the form and/or ink that may cause the effect.

In the present specific embodiment, however, the increased adhesion of ink as temperature is increased is used to advantage. In the embodiment, a formulation comprising a heat-sensitive cross-linkable ink and carbon black is coated over substantially the entirety of a generally ink-repellant/ink-releasing surface of a printing cylinder of a printing press by heating the formulation and/or the outer surface of the printing cylinder so that the formulation adheres to the cylinder to provide a continuous coating thereon. By using heat as described, the ink repellency/ink-releasing property of the printing cylinder surface can be overcome sufficiently to allow adhesion in the manner described.

The coated printing cylinder is then allowed to cool to ambient temperature whereafter it can be imaged using a digitally controlled laser. In imaged areas, laser energy is captured by the carbon black and heat is generated which causes cross-linking of the ink to provide an imaged area made up of the cross-linked ink adhered to the cylinder surface. (There is an increased adhesive force between the cross-linked ink and the cylinder surface compared to that between non-cross-linked ink and the surface).

The imaged printing cylinder may be developed during press start-up by application of waterless ink over the cylinder surface in order to remove the non-imaged areas comprising non-cross-linked ink. As a result, only imaged areas remain and these are ink-accepting since a major component of them is made up of cross-linked ink. Non-image areas are defined by the ink-repellant/ink-releasing surface of the printing cylinder. Thus, the image on the printing cylinder can be printed. During printing, the printing cylinder is maintained within a temperature band which is sufficiently low to prevent scumming of non-image areas. Thus, it is suitably cooled.

After completion of printing, the printing cylinder can be cleaned by using an appropriate solvent to solubilize the cross-linked ink in the imaged areas, and subsequently re-used.

EXAMPLE 2
Preparation of Substrate having Release Layer

A formulation was prepared by barrel rolling PS444(1.25 g), PS123(0.25 g), 0.2 g of 0.15% catalyst PC072 in xylene and methyl ethyl ketone (9.5 g) for 1 hour. The formulation was then coated onto a standard electrograined and anodized aluminum substrate using a Meyer bar, followed by drying at 130° C. for 3 minutes to give a dry film weight of 3 $gm^{-2}$.

EXAMPLE 3
Assessment of Effect of Temperature on Release Properties of Substrate A water bath was adapted to pump water through a steel heat exchanger which was attached to a piece of substrate prepared in Example 2. A thermocouple was placed in close contact with the substrate.

0.6 g of UV cyan ink PB377 was evenly rolled onto a piece of glass approximately 25×20 cm in size using a 15 cm long 2.5 cm diameter rubber roller.

The temperature of the piece of substrate was varied by adjusting the temperature of the water bath. PB377 ink was applied to the release layer of the substrate by rolling at three different speeds: 10 $cms^{-1}$ (slow); 30 $cms^{-1}$ (medium) and 50 $cms^{-1}$ (fast). After each application, the substrate was observed to assess whether it accepted ink (indicated by a "✓" in Table 1 below); whether it did not accept ink (indicated by a "x"); and whether slight ink acceptance was observed (indicated by "?").

TABLE 1

| Temperature | Application Speed | | | |
|---|---|---|---|---|
| (° C.) | Slow | Medium | Fast | Detail |
| 22 | ✓ | x | x | Block heating up |
| 25 | ✓ | x | x | |
| 30 | ✓ | x | x | |
| 37 | ✓ | ? | x | |
| 45* | ✓ | ✓ | ? | |
| 38 | ✓ | ? | x | Block cooling down |
| 32 | ✓ | x | x | |
| 12 | x | x | x | |
| 15 | ? | x | x | Block heating up |
| 16 | ? | x | x | |
| 17 | ? | x | x | |
| 18 | ? | x | x | |
| 19 | ? | x | x | |
| 21 | ? | x | x | |
| 22 | ? | x | x | |
| 23 | ? | x | x | |
| 24 | ✓ | x | x | |

*The ink was damaged about 45° C.

In general, the assessment shows that ink car be applied to the release substrate by slow rolling at a temperature of about 25° C. or above.

EXAMPLE 4
Imaging

In an initial test it was found that TV cyan ink PB377 did not absorb strongly at 830 nm and. Accordingly, it was necessary to sensitize the ink by incorporation of a suitable dye. In this regard KF654B (5 wt %) was worked into the ink using a palette knife and shown to have been incorporated by UV-Vis analysis. The dye containing ink was then dabbed onto a white plastics plate to give a film weight of 5 $gm^{-2}$ and, thereafter, a rectangle was imaged using a laser at 830 nm, 1Jcm$^{-2}$. The plate was washed in a UV blanket wash and wiped with cotton wool. The non-imaged area was easily removed leaving an imaged rectangle. The scratch resistance of the image was very good, although the film weight of the image was low.

In order to increase the film weight of imaged areas a further free radical initiator (dicumyl peroxide) which is sensitive at 830 nm was incorporated into the ink. The depth of the imaged area obtained in this case was found to be increased.

Thus, it has been shown that waterless ink can be applied at an elevated temperature to a support having a release layer and removed from the support by reducing the temperature; and that the ink can be imaged using a 830 nm laser.

The reader's attention is directed to all papers and documents which are filed concurrently with or previous to this specification in connection with this application and which are open to public inspection with this specification, and the contents of all such papers and documents are incorporated herein by reference.

All of the features disclosed in this specification (including any accompanying claims, abstract and drawings), and/or all of the steps of any method or process so disclosed, may be combined in any combination, except combinations where at least some of such features and/or steps are mutually exclusive.

Each feature disclosed in this specification (including any accompanying claims, abstract and drawings), may be replaced by alternative features serving the same, equivalent or similar purpose, unless expressly stated otherwise. Thus, unless expressly stated otherwise, each feature disclosed is one example only of a generic series of equivalent or similar features.

The invention is not restricted to the details of the foregoing embodiment(s). The invention extends to any novel one, or any novel combination, of the features disclosed in this specification (including any accompanying claims, abstract and drawings), or to any novel one, or any novel combination, of the steps of any method or process so disclosed.

We claim:

1. A method of preparing a waterless printing form precursor for subsequent imagewise exposure using a support having a surface which is less accepting of an ink-accepting formulation at a first viscosity relative to the acceptance of the surface to the ink-accepting formulation at a second viscosity, the method comprising contacting the ink-accepting formulation at said second viscosity with said surface in order to coat said surface with a continuous coating of said formulation.

2. A method according to claim 1, wherein said surface comprises a release material to render the surface less accepting of the ink-accepting formulation at said first viscosity relative to the acceptance of the surface to the ink-accepting formulation at said second viscosity.

3. A method according to claim 1, wherein said ink-accepting formulation or said surface, or both, has a first temperature which is increased so that during contact of the ink-accepting formulation and said surface the ink-accepting formulation has a second temperature, so that substantially the entirety of said surface can be coated.

4. A method according to claim 1, wherein said support is a cylinder of a printing press.

5. A method according to claim 1, wherein said surface is an integral part of a printing cylinder or is separable from a printing cylinder of a printing press.

6. A method according to claim 1, wherein said surface is part of a covering means which is releasably securable to a printing cylinder.

7. A method according to claim 1, wherein the viscosity of the ink-accepting formulation is changeable on exposure to radiation.

8. A method according to claim 7, wherein said ink-accepting formulation is capable of cross-linking or polymerizing, or both, on exposure.

9. A method according to claim 1, wherein said ink-accepting formulation comprises a first component which is ink-accepting and is capable of changing the viscosity of the ink-accepting formulation on exposure to radiation.

10. A method according to claim 9, wherein said first component comprises a material which is capable of cross-linking or polymerizing, or both, on exposure to radiation.

11. A method according to claim 9, wherein said first component is heat sensitive.

12. A method according to claim 9, wherein said first component comprises an ink.

13. A method according to claim 9, wherein said printing form precursor includes a second component arranged to absorb radiation and to co-operate with said first component for changing the viscosity of said ink-accepting formulation.

14. A method according to claim 13, wherein said component arranged to absorb radiation comprises a black body absorber.

15. A method according to claim 9, wherein said ink-accepting formulation of said printing form precursor includes a second component which is arranged to absorb radiation.

16. A method of preparing a waterless printing form precursor for subsequent imagewise exposure using a support having a surface which is less accepting to an ink-accepting formulation at a first temperature relative to the acceptance of the surface to the ink-accepting formulation at a second temperature, the method comprising contacting said surface and said ink-accepting formulation at said second temperature in order to coat said surface with a continuous coating of said formulation.

17. A method according to claim 16, wherein said second temperature is greater than said first temperature by at least 5° C.

18. A method according to claim 16, wherein said ink-accepting formulation has a first viscosity which is decreased so that during contact of the ink-accepting formulation and said surface the ink-accepting formulation has a second viscosity, so that substantially the entirety of said surface can be coated.

19. A method of preparing a waterless printing form having image and non-image areas, the method comprising:
(a) imagewise exposing a printing form precursor which comprises (i) a support having a surface which is less accepting of an ink-accepting formulation at a first viscosity relative to the acceptance of the surface to the ink-accepting formulation at a second viscosity and (ii) an ink-accepting formulation coated over substantially the entirety of said surface; and
(b) selectively removing areas under conditions wherein the viscosity of the ink-accepting formulation is different than said second viscosity.

20. A method according to claim 19, wherein an ink-accepting formulation is used in the removal of said areas.

21. A method according to claim 19, wherein imagewise exposure of said precursor comprises heat-mode imaging.

22. A method of preparing a printing form according to claim 19, the method comprising removing areas of said form by dissolution.

23. A method of preparing a waterless printing form having image and non-image areas, the method comprising:
   (a) imagewise exposing a printing form precursor which comprises (i) a support having a surface which is less accepting of an ink-accepting formulation at a first viscosity relative to the acceptance of the surface to the ink-accepting formulation at a second viscosity and (ii) an ink-accepting formulation coated over substantially the entirety of said surface; and
   (b) selectively removing areas at a temperature wherein the ink-accepting formulation has a viscosity which is higher than said second viscosity.

24. A method of preparing a waterless printing form having image and non-image areas, the method comprising:
   (a) imagewise exposing a printing form precursor which comprises a (i) support having a surface which is less accepting to ink at a first temperature relative to the acceptance of the surface to ink at a second temperature and (ii) an ink-accepting formulation coated over substantially the entirety of said surface; and
   (b) removing unexposed areas at a third temperature which is less than said second temperature.

25. A printing press for preparing a waterless printing plate for subsequent imagewise exposure comprising:
   (a) a support having a surface which is less accepting to ink relative to an ink-accepting formulation;
   (b) contact means for contacting said surface with the ink-accepting formulation in order to coat substantially the entirety of said surface; and
   (c) means for adjusting the viscosity of said ink-accepting formulation.

26. A press according to claim 25, wherein said means for adjusting viscosity includes a temperature adjustment means for adjusting the temperature of said ink-accepting formulation at the time of contact between the ink-accepting formulation and the surface.

27. A press according to claim 25, said press including imaging means for imaging the coating on said surface.

28. A method of waterless printing comprising:
   (a) preparing a waterless printing form having image and non-image areas by imagewise exposing a printing form precursor which comprises (i) a support having a surface which is less accepting to ink at a first temperature relative to the acceptance of the surface to ink at a second temperature and (ii) an ink-accepting formulation coated over substantially the entirety of said surface;
   (b) removing unexposed areas of said printing form precursor at a third temperature which is less than said second temperature; and
   (c) printing said image areas of the waterless printing form.

29. A method of preparing a waterless printing form having image and non-image areas, the method comprising:
   (a) imagewise exposing a printing form precursor which comprises (i) a support having a surface which is less accepting of an ink-accepting formulation at a first viscosity relative to the acceptance of the surface to the ink-accepting formulation at a second viscosity and (ii) an ink-accepting formulation coated over substantially the entirety of said surface; and
   (b) selectively removing areas under conditions wherein the viscosity of the ink-accepting formulation is different than said second viscosity, wherein an ink-accepting formulation is used in the removal of said areas.

30. A method of preparing a waterless printing form having image and non-image areas, the method comprising:
   (a) imagewise exposing a printing form precursor which comprises (i) a support having a surface which is less accepting of an ink-accepting formulation at a first viscosity relative to the acceptance of the surface to the ink-accepting formulation at a second viscosity and (ii) an ink-accepting formulation coated over substantially the entirety of said surface; and
   (b) selectively removing areas under conditions wherein the viscosity of the ink-accepting formulation is different than said second viscosity, wherein areas of said form are removed by dissolution.

* * * * *

UNITED STATES PATENT AND TRADEMARK OFFICE
CERTIFICATE OF CORRECTION

PATENT NO. : 6,058,841  
DATED : May 9, 2000  
INVENTOR(S) : Ray et al.

Page 1 of 2

It is certified that error appears in the above-identified patent and that said Letters Patent is hereby corrected as shown below:

ON THE COVER:

[57] ABSTRACT, line 11: "cylindter" should read -- cylinder --;

[73] Assignee: "Norwal," should read -- Norwalk, --;

IN THE CLAIMS:

Column 11, line 16: "a (i)" should read -- (i) a --.

IN THE SPECIFICATION:

Column 1, line 16: "hydrophillic" should read -- hydrophilic --;

Column 1, line 21: "oil based" should read -- oil-based --;

Column 1, line 30: "irk-water" should read -- ink-water --;

Column 2, line 5: "hydrophillic" should read -- hydrophilic --;

Column 2, line 6: "radiation sensitive" should read -- radiation-sensitive --;

Column 2, line 8: "hydrophillic" should read -- hydrophilic --;

Column 2, line 12: "planograrhic" should read -- planographic --;

Column 2, line 60: "rot" should read -- not --;

Column 4, line ~30: "byz" should read -- by --;

Column 4, line 56: "refer" should read -- refers --;

Column 4, line 59: "non-ink accepting" should read -- non-ink-accepting --;

Column 4, line 60: "may-comprise" should read -- may comprise --;

Column 5, line 4: "sand" should read -- said --;

Column 5, line 41: "temperature, wherein" should read -- temperature wherein --;

UNITED STATES PATENT AND TRADEMARK OFFICE
CERTIFICATE OF CORRECTION

PATENT NO. : 6,058,841
DATED : May 9, 2000
INVENTOR(S) : Ray et al.

It is certified that error appears in the above-identified patent and that said Letters Patent is hereby corrected as shown below:

Column 6, line 44: "of" should read -- if --;

Column 7, line 10: "Inc" should read -- Inc. --;

Column 7, line 20: "Ha" should read -- Haën --;

Column 7, line 21: "ën" should be deleted;

Column 8, line 62: "and. Accordingly," should read -- and, accordingly, --;

Signed and Sealed this

Twenty-second Day of May, 2001

*Attest:*

NICHOLAS P. GODICI

*Attesting Officer*     Acting Director of the United States Patent and Trademark Office